United States Patent
Chen et al.

(10) Patent No.: US 12,062,561 B2
(45) Date of Patent: *Aug. 13, 2024

(54) METHOD FOR TRANSPORTING WAFERS

(71) Applicant: TAIWAN SEMICONDUCTOR MANUFACTURING CO., LTD., Hsinchu (TW)

(72) Inventors: Wei-Chih Chen, Taichung (TW); Shi-Chi Chen, Taichung (TW); Ting-Wei Wang, Taichung (TW); Jen-Ti Wang, Taichung (TW); Kuo-Fong Chuang, Taoyuan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 49 days.

This patent is subject to a terminal disclaimer.

(21) Appl. No.: 17/748,932

(22) Filed: May 19, 2022

(65) Prior Publication Data
US 2022/0285190 A1 Sep. 8, 2022

Related U.S. Application Data

(63) Continuation of application No. 16/683,998, filed on Nov. 14, 2019, now Pat. No. 11,348,817.

(60) Provisional application No. 62/772,947, filed on Nov. 29, 2018.

(51) Int. Cl.
*H01L 21/677* (2006.01)
*H01L 21/67* (2006.01)

(52) U.S. Cl.
CPC .. *H01L 21/67733* (2013.01); *H01L 21/67259* (2013.01); *H01L 21/67706* (2013.01)

(58) Field of Classification Search
CPC ................ H01L 25/0657; H01L 24/32; H01L 2225/06562; H01L 2225/06548; H01L 2224/32145
See application file for complete search history.

(56) References Cited

U.S. PATENT DOCUMENTS

| | | | |
|---|---|---|---|
| 10,156,794 B1* | 12/2018 | Yu | G01B 11/27 |
| 2002/0057933 A1* | 5/2002 | Ebihara | G03G 15/0131 |
| | | | 399/303 |
| 2003/0187537 A1* | 10/2003 | Hocke | H01L 21/67294 |
| | | | 700/121 |
| 2005/0035313 A1* | 2/2005 | Garssen | H01L 21/67265 |
| | | | 250/559.33 |

(Continued)

FOREIGN PATENT DOCUMENTS

| | | |
|---|---|---|
| JP | 11349280 A | 3/1982 |
| KR | 20200049227 A | 5/2020 |
| WO | 2010010795 A1 | 1/2010 |

*Primary Examiner* — Jarrett J Stark
(74) *Attorney, Agent, or Firm* — Maschoff Brennan

(57) ABSTRACT

A method includes moving a wafer transport device to a position above a load port; lowering a hoist unit of the wafer transport device above the load port, wherein the wafer transport device has a plurality of belts, each of the belts is connected to the hoist unit and wound around a respective belt winding drum; detecting sound waves from the belts by using at least one acoustic sensor to measure tensions of the belts; and comparing the tensions from the belts to determine an inclination of the hoist unit.

20 Claims, 11 Drawing Sheets

(56) References Cited

U.S. PATENT DOCUMENTS

| | | | |
|---|---|---|---|
| 2006/0045665 A1* | 3/2006 | Hall | H01L 21/67196 414/217 |
| 2007/0025750 A1* | 2/2007 | Ando | G03G 15/2032 399/69 |
| 2009/0304421 A1* | 12/2009 | Saito | G03G 15/2053 399/329 |
| 2013/0273649 A1* | 10/2013 | Wu | C12N 5/0606 435/325 |
| 2017/0092516 A1* | 3/2017 | van Gogh | H01L 21/67161 |
| 2019/0148196 A1* | 5/2019 | Lin | G01N 25/68 73/29.01 |
| 2020/0105555 A1* | 4/2020 | Lin | H01L 21/67736 |
| 2020/0118853 A1* | 4/2020 | Harasaki | G06T 7/0004 |
| 2020/0176294 A1* | 6/2020 | Chen | H01L 21/67736 |
| 2021/0249297 A1* | 8/2021 | Chu | H01L 21/67742 |

\* cited by examiner

METHOD FOR TRANSPORTING WAFERS

PRIORITY CLAIM AND CROSS-REFERENCE

This application is a continuation application of U.S. patent application Ser. No. 16/683,998, filed Nov. 14, 2019, issued as U.S. patent Ser. No. 11/348,817 on May 31, 2022, which claims priority to U.S. Provisional Application Ser. No. 62/772,947, filed Nov. 29, 2018, which is herein incorporated by reference.

BACKGROUND

In a wafer manufacturing process, wafers are processed multiple times at different process chambers. Wafers are stored in wafer container units such as a front opening unified pod or a wafer cassette. The wafer container units are temporarily positioned on load ports near certain process chambers, and moved from one load port to another. An automated handling system is used for transporting the wafer container units between process bays.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
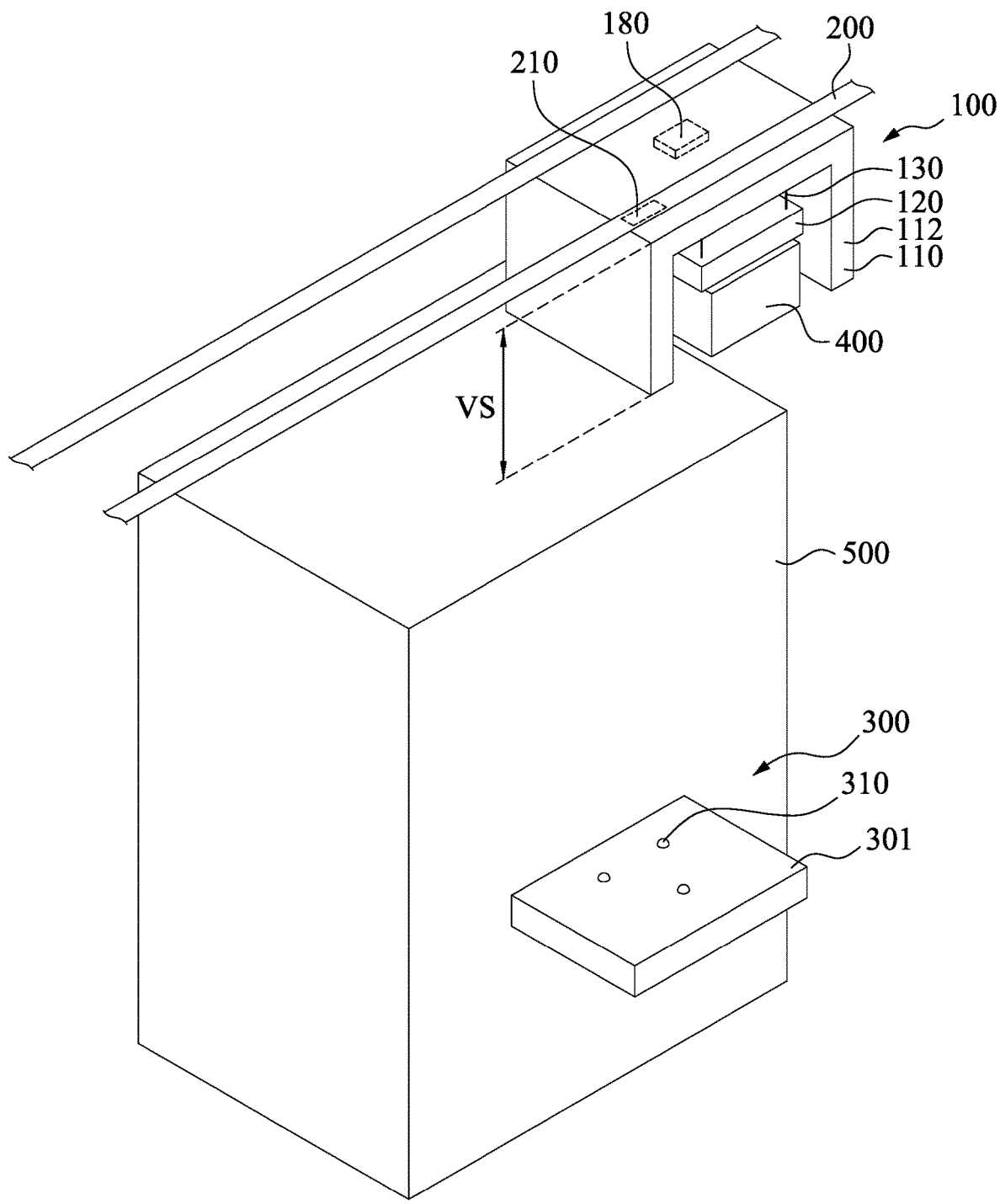
FIG. 1 shows a perspective view of a part of a wafer transport system, a wafer container unit, and a semiconductor tool having a load port in a semiconductor fabrication facility (FAB) according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around", "about", "approximately", or "substantially" shall generally mean within 20 percent, or within 10 percent, or within 5 percent of a given value or range. Numerical quantities given herein are approximate, meaning that the term "around", "about", "approximately", or "substantially" can be inferred if not expressly stated.

The embodiments of this disclosure relate to wafer transport systems and more specifically to wafer transport systems with hoist position alignments and/or attitude inspections. The attitude of an object herein is the orientation of the object with respect to a horizontal plane, and consists of up to three components respectively in three axes perpendicular to each other. Because of the alignments and/or inspections, a wafer transport system with good alignment between a wafer container unit and a corresponding load port (or a hoist of the wafer transport system) may be obtained. The wafer transport system may be used in an automated material handling system (AMHS) that may include at least one of overhead hoist transfer (OHT), overhead shuttle (OHS), rail guided vehicle (RGV), automated guided vehicle (AGV), personal guided vehicle (PGV), or combinations thereof.

FIG. 1 shows a perspective view of a part of a wafer transport system, a wafer container unit 400, and a semiconductor tool 500 having a load port 300 in a semiconductor fabrication facility (FAB) according to some embodiments of the present disclosure. In some embodiments, the FAB is divided into various process bays (not shown) such as ion implantation bay, lithography bay, deposition bay, etching bay, diffusion bay, test bay and the like, each including multiple semiconductor tools with the same or different functions, for performing various processes in chip fabrication. The wafer transport system transports wafers or reticles between semiconductor tools either in the same process bay (i.e. intra-bay transportation) or between process bays (i.e. inter-bay transportation) during the fabrication process.

Referring to FIG. 1, in some embodiments of the present disclosure, the wafer transport system includes a network of transport rails 200 and a wafer transport device 100 movably arranged on the transport rails 200. The transport rails 200 are configured to guide the movement of one or more wafer transport device 100 supported and suspended from the transport rails 200. In some embodiments, the transport rails 200 are monorails that are mounted to and suspended from the ceiling of the FAB. It should be appreciated that the transport rails 200 may have any suitable configuration so long as the wafer transport device 100 are appropriately supported from the transport rails 200 for rolling motion.

In some embodiments of the present disclosure, the transport rail 200 is configured to reach different parts of a wafer fabrication lab where wafers are to be transported to. Load ports 300 can be selectively arranged under certain positions of the transport rail 200. Rail marks 210 may be arranged on the transport rail 200 at positions above the load ports 300, and the wafer transport device 100 can further include a marking scanner and a controller 180 that are electrically connected. The marking scanner is directed toward the transport rail 200, and configured to scan the bottom surface of the transport rail 200. When the wafer transport device 100 reaches a position on the transport rail 200 having a rail mark 210, the marking scanner of the wafer transport device 100 scans the rail mark 210 and sends a signal corresponding to the rail mark 210 to the controller 180 of the wafer transport device 100. Depending on the signal sent from the marking scanner to the controller 180, the controller 180 can control the wafer transport device 100 to take a corresponding action. The actions can include stopping the wafer transport device 100 (thereby stopping the wafer transport device 100 above the corresponding load port 300), rotating the hoist unit 120 (thereby aligning the hoist unit 120 with an orientation of the load port 300), or a combination of the above.

In some embodiments of the present disclosure, the load port 300 has a top surface 301 for accommodating a wafer container unit 400, and protrusions 310 on the top surface 301 for engaging the wafer container unit 400 such that the wafer container unit 400 is secured when the wafer container unit 400 is disposed on the load port 300. The protrusions 310 of the load port 300 are male units for kinematic coupling, and are configured to couple to corresponding grooves 420 on a bottom side of the wafer container unit 400 (as show in FIG. 9). As shown in FIG. 1, the three protrusions 310 are non-linear, and when the three protrusions 310 are coupled to the three corresponding grooves 420 of the wafer container unit 400, the wafer container unit 400 is restricted in three degrees of freedom (i.e. linear motion in two horizontal directions, and rotation about a vertical axis). The protrusions 310 do not restrict a vertical motion of the wafer container unit 400, and the hoist unit 120 is free to raise and lower the wafer container unit 400 from and to the load port 300.

Figure 2:
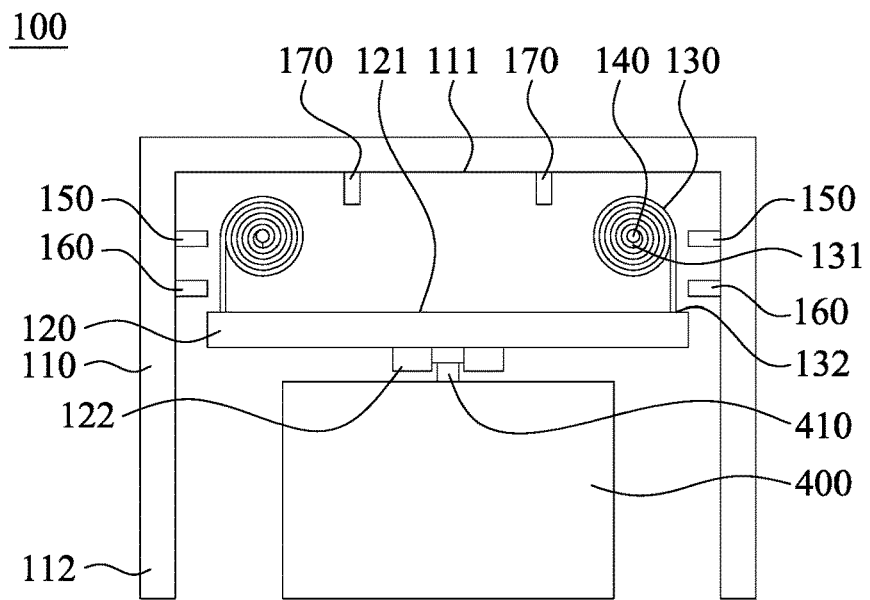
FIG. 2 shows a side view of the wafer transport device and the wafer container unit in FIG. 1 according to some embodiments of the present disclosure.

FIG. 2 shows a side view of the wafer transport device 100 and the wafer container unit 400 in FIG. 1 according to some embodiments of the present disclosure. The wafer transport device 100 is operable to transport wafer container units or reticle container units (hereinafter referred to as "container units") 400 throughout the FAB for intra-bay or inter-bay movement. Each wafer transport device 100 is configured and structured to hold a wafer container unit 400 housing one or more wafers or reticles, and transport the wafer container unit 400 in a horizontal or lateral direction from one location to another within the FAB. In addition, each wafer transport device 100 is configured and operable to pickup, raise/lower, hold, articulate, and release a wafer container unit 400.

In some embodiments, the wafer container units 400 include standard mechanical interface (SMIF) pods which can hold a plurality of wafers (e.g. 200 mm or 8 inch), or front opening unified pods (FOUPs) which can hold larger wafers (e.g. 300 mm (12 inch) or 450 mm (18 inch)). Each of the wafer container units 400 may hold on the order of approximately 25 wafers, for example. Alternatively or additionally, the wafer container units 400 may include other SMIF pods which can hold one or more reticles.

Figure 3:
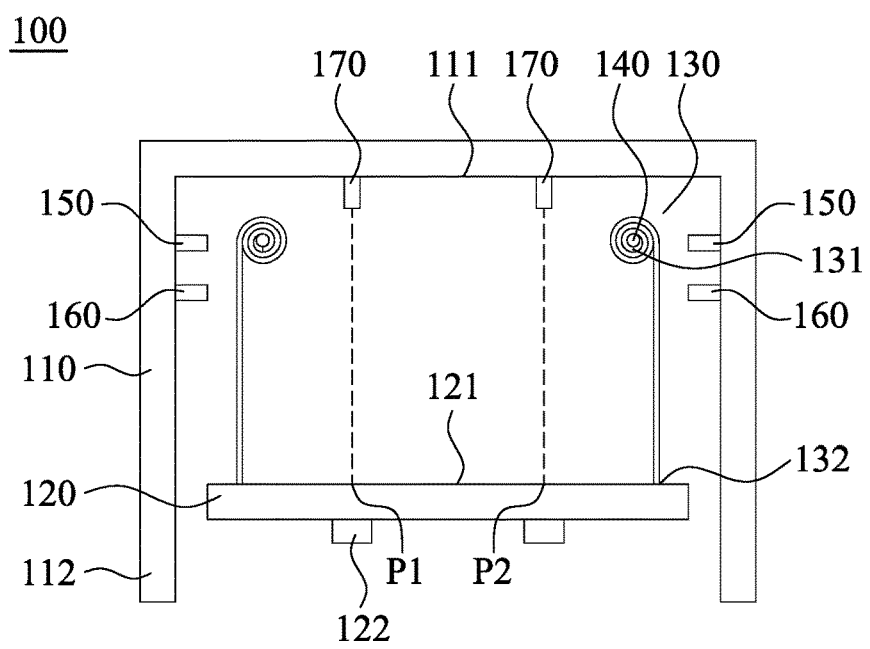
FIG. 3 shows another schematic diagram of a wafer transport device in FIG. 1 according to some embodiments of the present disclosure.

The wafer transport device 100 includes a main body 110, a plurality of belt winding drums 140 disposed on the main body 110, a plurality of belts 130, a plurality of winding cameras 150, and a hoist unit 120. Each one of the belts 130 has a drum end 131 connected to one of the belt winding drums 140, and a hoist end 132 connected to the hoist unit 120. The belts 130 are respectively wound around the belt winding drums 140. A degree of winding of each one of the belts 130 refers to how much of the belt 130 is wound around the respective belt winding drum 140. A higher degree of winding corresponds to a greater portion of the belt 130 being wound around the belt winding drum 140. A smaller degree of winding corresponds to a smaller portion of the belt 130 being wound around the belt winding drum 140. As shown in FIG. 2, when the belt 130 has a high degree of winding, a smaller portion of the belt 130 hangs from the belt winding drum 140 of the wafer transport device 100, and the distance between the hoist unit 120 and the belt winding drums 140 is smaller. FIG. 3 shows another side view of the wafer transport device in FIG. 1 according to some embodiments of the present disclosure. As shown in FIG. 3, when the belt 130 has a small degree of winding, a greater portion of the belt 130 hangs from the belt winding drum 140 of the wafer transport device 100, and the distance between the hoist unit 120 and the belt winding drums 140 is greater. Therefore, the height of the hoist unit 120 can be controlled by adjusting the degrees of winding of the belts 130 around the respective belt winding drums 140.

In some embodiments of the present disclosure, the hoist unit 120 has a gripper 122 configured to grip or release the wafer container unit 400. Specifically, as shown in FIG. 2, the wafer container unit 400 has a flange 410 configured to be gripped by the gripper 122 of the hoist unit 120. The wafer container unit 400 can be gripped by the hoist unit 120 and transported along the transport rail 200 by the wafer transport device 100, and loaded onto or lifted from the load ports 300 arranged at selected locations.

As shown in FIG. 1, when the wafer transport device 100 moves on the transport rail 200, the degrees of winding of the belts 130 can be high, such that the hoist unit 120 is raised close to the main body 110 of the wafer transport device 100 and transported along the transport rail 200 in a safe manner, within a vertical space VS in which the wafer transport device 100 can move without being obstructed by persons or equipment. In some embodiments of the present disclosure, the main body 110 has a plurality of walls 112 and the hoist unit 120 can be raised to a position between the walls 112, such that the hoist unit 120 is accommodated in the main body 110 of the wafer transport device 100. In this condition, the wafer container unit 400 gripped by the hoist unit 120 is also accommodated in the main body 110 of the wafer transport device 100, such that the wafer container unit 400 is transported safely inside the main body 110 and within the vertical space VS.

By adjusting the degrees of winding of the belts 130 of the wafer transport device 100, the height of the hoist unit 120 of the wafer transport device 100 can be adjusted. Specifically, the hoist unit 120 can be lowered to grip and pick up the wafer container unit 400 from the load port 300, and raised along with the wafer container unit 400 to the main body 110, whereby the wafer container unit 400 can be transported by the wafer transport device 100 along the transport rail 200. At a target destination, the hoist unit 120 can be lowered to release the wafer container unit 400 onto the load port 300, and raised to the main body 110, whereby the wafer transport device 100 can await another transport assignment. The wafer container unit 400 can be transported by the wafer transport device 100 from one load port 300 to another load port 300.

In some embodiments of the present disclosure, when loading or unloading the wafer container unit 400 on the load port 300, the attitude of the hoist unit 120 is kept substantially the same as the attitude of the ground such that wafers inside the wafer container unit 400 are not disturbed. Specifically, the attitude of the hoist unit 120 herein is a direction of a line normal to a top surface 121 of the hoist unit 120, and the attitude of the ground is a direction of a line normal to the ground (i.e. a vertical line). In some embodiments of the present disclosure, when loading or unloading the wafer container unit 400 on the load port 300, the attitude of the hoist unit 120 is kept substantially the same as the attitude of the top surface 301 of the load port 300 (direction of a line normal to the top surface 301), so as to allow the wafer container unit 400 to successfully engage or disengage the top surface 301 of the load port 300 in a smooth manner. In other words, the top surface 121 of the hoist unit 120 is kept parallel to a predetermined surface when the hoist unit 120 grips or releases the wafer container unit 400. If the top surface 121 of the hoist unit 120 is not substantially parallel to the predetermined surface, then the wafer transport device 100 is sent to a maintenance area for maintenance.

Figure 4A:
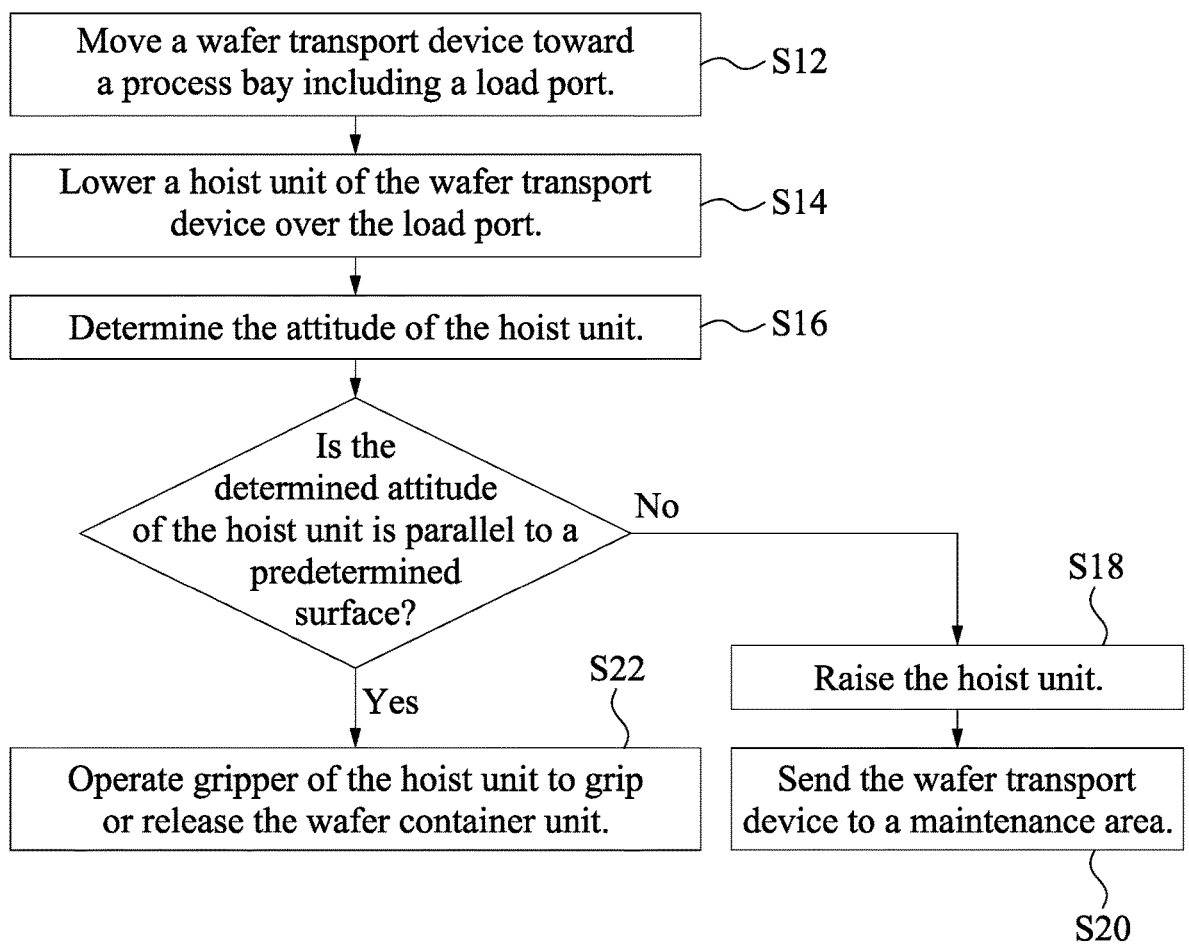
FIG. 4A shows a flowchart of a method according to some embodiments of the present disclosure.

FIG. 4A shows a flowchart of a method M10 according to some embodiments of the present disclosure. The method M10 is merely an example, and is not intended to limit the present disclosure beyond what is explicitly recited in the claims. Additional operations can be provided before, during, and after the method M10, and some operations described can be replaced, eliminated, or moved around for additional embodiments of the process. In some embodiments, the method M10 may be applied in a FAB. Specifically, the method M10 may be applied to, but should not be limited to, the wafer transport device 100 of FIG. 1. For clarity and ease of explanation, some elements of the figures have been simplified.

In operation S12 of the method M10, a wafer transport device is moved toward a process bay including a load port. Referring to FIGS. 1 and 4A, the wafer transport device 100 is suspended from the transport rail 200. The controller 180 of the wafer transport system controls the movement of the wafer transport device 100, such that the wafer transport device 100 is moved on the transport rail 200.

The wafer transport device 100 is moved toward a process bay. The process bay may be an ion implantation bay, lithography bay, deposition bay, etching bay, diffusion bay, test bay and the like, each including multiple semiconductor tools 500 with the same or different functions, for performing various processes in chip fabrication. The semiconductor tools 500 may include any type of wafer processing, metrology, inspection, testing or other tools, and wafers or reticles storage equipment such as stockers used in semiconductor chip fabrication.

In some embodiments, each semiconductor tool 500 includes one or more load ports 300 configured to support and dock the wafer container unit 400 for facilitating insertion and removal of wafers or reticles into/from the semiconductor tool 500. As shown in FIG. 1, the load port 300 is a plate structure extended from the semiconductor tool 500 and positioned under the transport rail 200 of the wafer transport system so as to receive/support the wafer container unit 400.

In some embodiments, there are many rail marks 210 on the bottom surface of the transport rail 200. The marking scanner of the wafer transport device 100 senses the bottom surface of the transport rail 200 when the wafer transport device 100 is moving on the transport rail 200. When the marking scanner senses a predetermined rail mark 210, the wafer transport device 100 receives a stop demand from the controller 180. Hence, the wafer transport device 100 is stopped over the predetermined load port 300. On the other hand, when the marking scanner senses another rail mark, the wafer transport system does not send a stop demand to the wafer transport device 100. In this case, the wafer transport device 100 is still moving on the transport rail 200.

In operation S14 of the method M10, a hoist unit of the wafer transport device over the load port is lowered. Referring to FIGS. 3 and 4A, after the wafer transport device 100 is stopped over the predetermined load port 300, the belt winding drums 140 rotate to unwind the belts 130. As such, the hoist unit 120 can be lowered to a predetermined level.

In operation S16 of the method M10, the attitude of the hoist unit is determined. Referring to FIGS. 3 and 4A, the attitude of the hoist unit 120 depends on the lengths of the belts 130 hanging between the respective belt winding drums 140 and the hoist unit 120. The attitude of the hoist unit 120 can be adjusted by adjusting the lengths of the belts 130. The lengths of the belts 130 are kept substantially equal to maintain a constant attitude for the hoist unit 120.

In some embodiments of the present disclosure, as shown in FIG. 3, the attitude of the hoist unit 120 is determined by measuring a first distance between a first position P1 of a top surface 121 of the hoist unit 120 and a bottom surface 111 of the wafer transport device 100, measuring a second distance between a second position P2 of the top surface 121 of the hoist unit 120 and the bottom surface 111 of the wafer transport device 100, and comparing the first distance and the second distance. In some embodiments, the hoist unit 120 and a predetermined surface have substantially the same attitude when the first distance and the second distance are substantially the same. The predetermined surface can be the ground, or the top surface 301 of the load port 300, or both. As shown in FIG. 3, the wafer transport device 100 further includes two distance sensors 170 arranged on the bottom surface 111 of the wafer transport device 100. The distance sensors 170 are directed toward the first position P1 and the second position P2 of the top surface 121 of the hoist unit 120. In some embodiments, the distance sensors 170 are laser distance sensors or other suitable sensors.

Figure 5A:
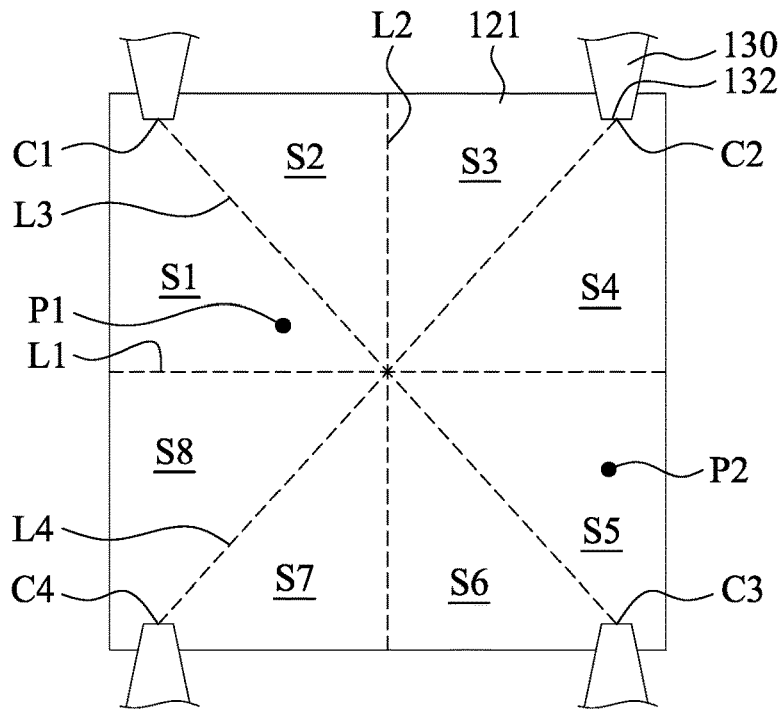
FIGS. 5A and 5B show top views of a top surface of a hoist unit of FIG. 1 according to some embodiments of the present disclosure.
Figure 5B:
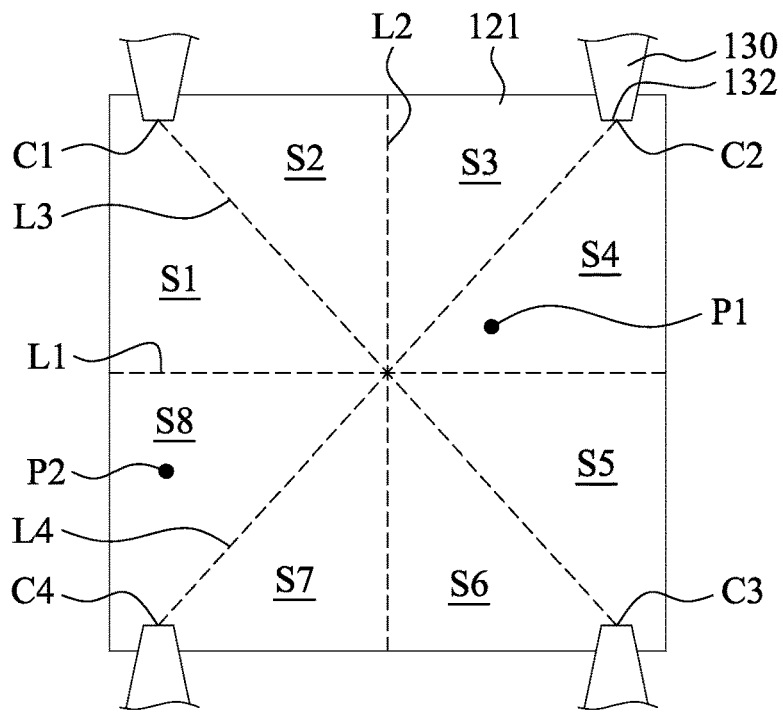

FIGS. 5A and 5B show top views of the top surface 121 of the hoist unit 120 of FIG. 1 according to some embodiments of the present disclosure. In some embodiments of the present disclosure, the hoist ends 132 of the belts 130 are connected to the hoist unit 120 near four corners of the top surface 121 of the hoist unit 120. Line L1 passes through the center C of the top surface 121 of the hoist unit 120, and is parallel to two edges of the top surface 121 of the hoist unit 120. Line L2 passes through the center C of the top surface 121 of the hoist unit 120, and is parallel to the other two edges of the top surface 121 of the hoist unit 120. Line L3 passes through the center C and the corners C1, C3 opposite each other. Line L4 passes through the center C and the corners C2, C4 opposite each other. The winding drum 140 connected to one of the belts 130 and the hoist end 132 of said belt 130 has a distance therebetween. When said belt 130 is connected to the top surface 121 of the hoist unit 120 at the corner C1, and said distance between the winding drum 140 and the hoist end 132 corresponding to said belt 130 is shorter or longer than distances between the winding drums 140 and the hoist ends 132 corresponding to the other belts 130 connected at the corners C1, C2, and C4, the corner C1 is respectively titled upward or downward with respect to the rest of the top surface 121 of the hoist unit 120. Similarly, when one of the belts 130 is connected to the top surface 121 of the hoist unit 120 at the corner C2, C3, or C4, and the distance between the winding drum 140 and the hoist end 132 corresponding to said belt 130 is shorter or longer than distances between the winding drums 140 and the hoist ends 132 corresponding to the other belts 130 connected at the other corners, the corner C2, C3, or C4 is respectively titled upward or downward with respect to the rest of the top surface 121 of the hoist unit 120. Referring to FIG. 5A, when the corner C1 is tilted upward or downward, the first distance and the second distance are different if the first position and the second position of the top surface of the hoist unit are on different sides of the line L4. Similarly, when the corner C3 is tilted upward or downward, the first distance and the second distance are different if the first position and the second position on the top surface of the hoist unit are on different sides of the line L4. Similarly, when the corner C2 or the corner C4 is tilted upward or downward, the first distance and the second distance are different if the first position and the second position on the top surface of the hoist unit are on different sides of the line L3.

When the adjacent corners C1 and C4 are both tilted upward or both tilted downward with respect to the other two corners C2 and C3, then the first distance and the second distance are different if the first position and the second position on the top surface of the hoist unit are on different sides of the line L2. Similarly, when the adjacent corners C1 and C2 are both tilted upward or both tilted downward with respect to the other two corners C3 and C4, then the first distance and the second distance are different if the first position and the second position on the top surface of the hoist unit are on different sides of the line L1.

Therefore, if the first position and the second position are on different sides of the four lines L1, L2, L3, and L4, then the first distance and the second distance are different when the top surface of the hoist unit tilts toward any one or any two adjacent of the corners C1, C2, C3, C4. In some embodiments of the present disclosure, the first position and the second position are on different sides of each of the four lines L1, L2, L3, and L4. In other words, the four lines L1, L2, L3, L4 partition the top surface 121 of the hoist unit 120 into eight sections S1-S8, and the first position P1 and the second position P2 are on opposite sections, such as sections S1 and S5 as shown in FIG. 5A, or sections S3 and S7 as shown in FIG. 5B.

In some embodiments of the present disclosure, the attitude of the hoist unit 120 is determined by measuring a tension of each of the belts 130. Referring to FIG. 2, the wafer transport device 100 further includes a tension sensor 160, and the tension of each of the belts 130 can be measured by using the tension sensor 160. In some embodiments, the tension sensor 160 may be an acoustic sensor configured to detect and analyze sound waves from the belt 130. Specifically, when the hoist unit 120 is lowered, the belts 130 will vibrate. The frequency of the vibration of the belt 130 depends on the length thereof. As such, the tension sensor 160 may sense the sound waves of the corresponding belt 130, and the vibration frequency may be analyzed, e.g., via machine learning, to determine the tension of the belt 130.

The tension sensor 160 may be arranged proximal to a portion of the belt 130 under stress, namely the portion of the belt 130 extending between the belt winding drum 140 and the hoist unit 120. The tensions may be uneven when the hoist unit 120 is tilted toward one side or one corner. It is noted that the acoustic sensor mentioned above is an example, and should not limit the scope of the present disclosure. Other suitable sensors may be applied to this operation as long as the length of the belt 130 can be detected.

In some embodiments of the present disclosure, data are fed to a machine learning system to analyze relationship between vibration frequencies of the belts 130 and the tensions of the belts 130. Specifically, the vibration frequency of the belt 130 is measured by the acoustic tension sensor 160, and the tension of the belt 130 is determined by another sensor (e.g. a tension meter) or by inspecting the winding of the belt 130 around the corresponding winding drum 140, and the vibration frequency and the tension of the belt 130 are fed as a related data pair to the machine learning system. The machine learning system analyzes a plurality of data pairs of related vibration frequencies and tensions, and derives a rule for associating specific vibration frequencies of the belt 130 to specific tensions of the belts 130, respectively. In operation S18, S20, and S22 of the method M10, a response is provided according to the determined attitude. In some embodiments of the present disclosure, when the determined attitude of the hoist unit is not the same as the attitude of a predetermined surface (e.g. the top surface of the load port, and/or the ground), the response includes raising the hoist unit (operation S18) and sending the wafer transport device to a maintenance area (operation S20). Specifically, the hoist unit 120 of the wafer transport device 100 may be inclined if the determined attitude is not the same as the attitude of the predetermined surface. This inclined hoist unit 120 is sent to the maintenance area, and an attitude calibration is performed on the inclined hoist unit 120.

When the determined attitude of the hoist unit is the same as the attitude of the predetermined surface, the response includes operating the gripper 122 of the hoist unit to grip or release the wafer container unit (operation 22). In some embodiments, the wafer container unit 400 is initially disposed on the load port 300, and the hoist unit 120 may grip the wafer container unit 400 after the attitude is determined to be the same as the attitude of the predetermined surface. In some other embodiments, the wafer container unit 400 is initially gripped by the hoist unit 120 and is transported using the wafer transport device 100. The hoist unit 120 may release the wafer container unit 400 on the load port 300 after the attitude is determined to be the same as the attitude of the predetermined surface.

Figure 4B:
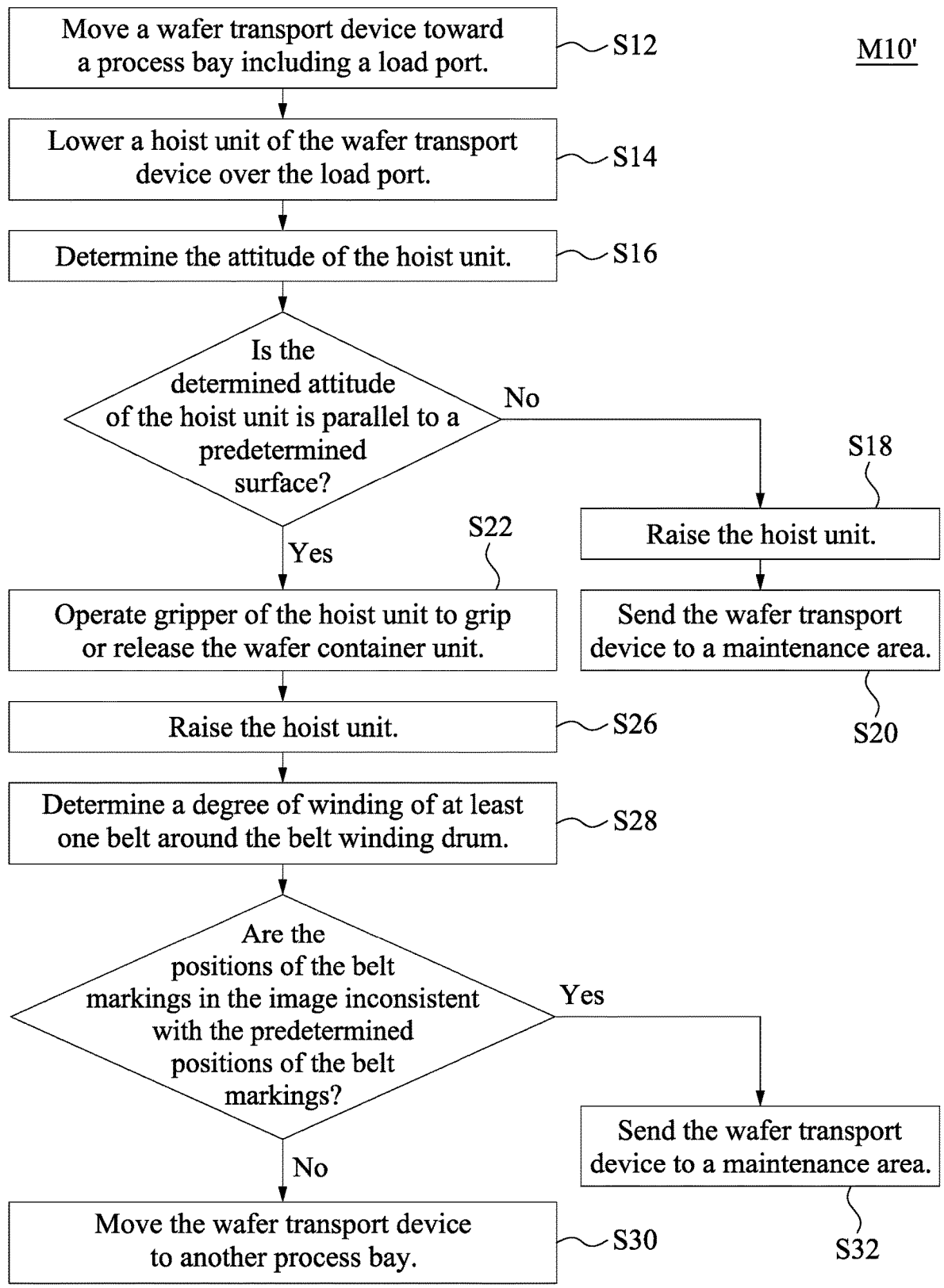
FIG. 4B shows a flowchart of a method according to some embodiments of the present disclosure.

FIG. 4B shows a flowchart of a method M10' according to some embodiments of the present disclosure. The method M10' is merely an example, and is not intended to limit the present disclosure beyond what is explicitly recited in the claims. Additional operations can be provided before, during, and after the method M10, and some operations described can be replaced, eliminated, or moved around for additional embodiments of the process. The operations S12, S14, S16, S18, S20, and S22 of method M10' are the same as the operations S12, S14, S16, S18, S20, and S22 of method M10, and the detailed description is omitted herein.

In operation S26 of method M10', the hoist unit is raised. Referring to FIGS. 1 and 2, after the hoist unit 120 grips or releases the wafer container unit 400, the hoist unit 120 is raised by the controller 180 for the next transporting mission. In some embodiments, the belt winding drums 140 rotate, such that the belts 130 respectively wind the belt winding drums 140 again, and the hoist unit 120 is raised to a predetermined level.

Figure 6A:
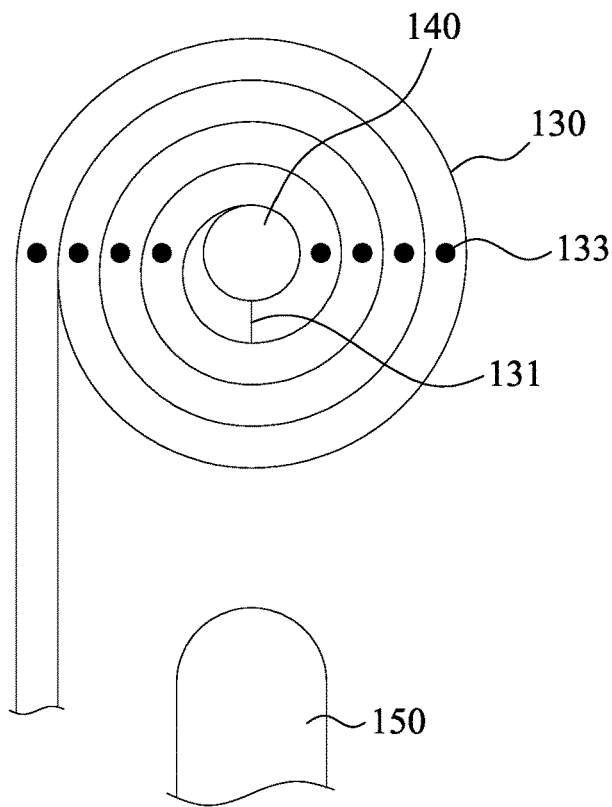
FIGS. 6A and 6B show schematic diagrams of a belt wound around a belt winding drum according to some embodiments of the present disclosure.
Figure 6B:
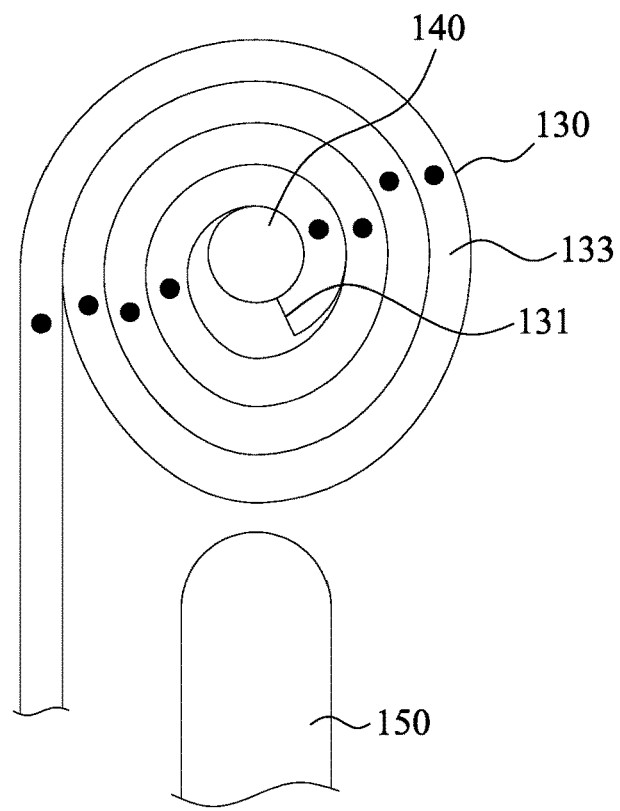

In operation S28 of method M10', a degree of winding of at least one belt around the belt winding drum is determined. FIGS. 6A and 6B show schematic diagrams of a belt 130 wound around a belt winding drum 140 according to some embodiments of the present disclosure. In some embodiments of the present disclosure, at least one of the belts 130 has a plurality of belt markings 133 on a side thereof. After the hoist unit 120 is raised, an image of the belt markings 133 of the belt 130 is captured by the winding camera 150 positioned proximal to a portion of the belt 130 wound around the respective belt winding drum 140 as shown in FIG. 2. In some embodiments, the winding camera 150 is positioned to directly face the side of the belt 130 formed with the belt markings 133 as shown in FIGS. 6A and 6B. The positions of the belt markings 133 in the captured image are compared to predetermined positions of the belt markings 133, so as to determine the degree of winding of the belt 130. In some embodiments, the predetermined positions of the belt markings 133 may be determined by capturing an image of the belt markings 133 when the corresponding wafer transport device 100 is new. Alternatively, the predetermined positions of the belt markings 133 may be determined by capturing an image of the belt markings 133 after the attitude of the hoist unit 120 is properly calibrated.

In operation S30 of method M10', the wafer transport device is moved to another load port when the positions of the belt markings in the image are consistent with the predetermined positions of the belt markings. That is, the wafer transport device 100 is in a good condition to transport wafer container units. In operation S32 of method M10', the wafer transport device is sent to a maintenance area when the positions of the belt markings in the image are inconsistent with the predetermined positions of the belt markings. When the positions of the belt markings 133 as shown in FIG. 6B are not the same as the predetermined positions of the belt markings 133 as shown in FIG. 6A, the wafer transport device 100 is sent to the maintenance area to recalibrate the attitude of the hoist unit 120.

Figure 7:
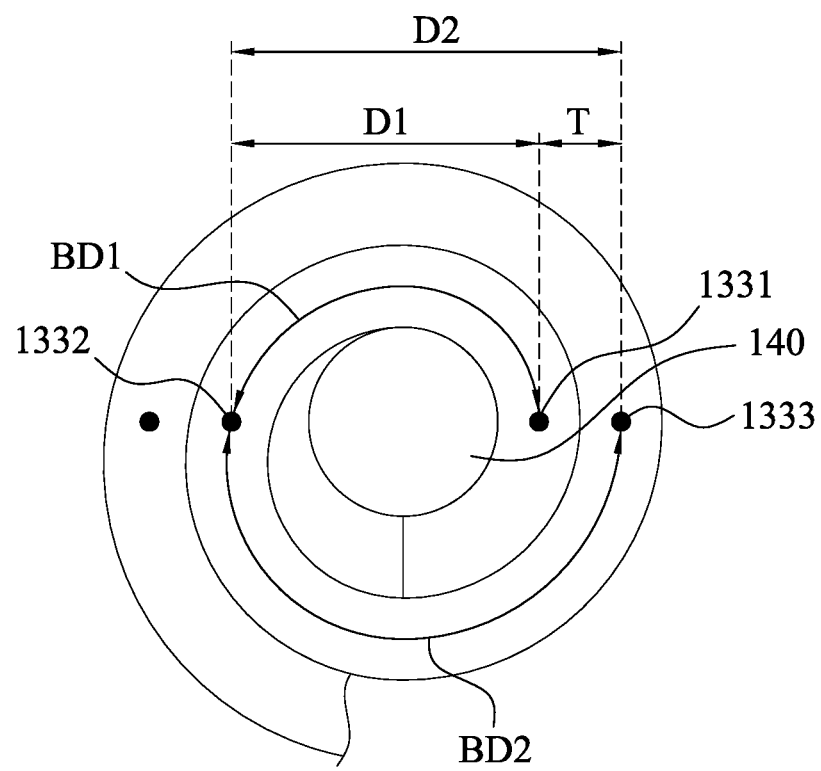
FIG. 7 shows a schematic diagram of a belt having belt markings wound around a belt winding drum according to some embodiments of the present disclosure.

In some embodiments of the present disclosure, the belt markings 133 on the side of the belt 130 form a line pattern when they are at their respective predetermined positions, as shown in FIG. 6A. The belt markings 133 align at every 180 degrees of the belt wrapped around the belt winding drum 140. The belt distance between consecutive belt markings on the belt increases from the drum end 131 of the belt 130 to the hoist end 132 of the belt 130. FIG. 7 shows a schematic diagram of a belt having belt markings 1331, 1332, and 1333 wound around a belt winding drum 140 according to some embodiments of the present disclosure. Specifically, a diameter D1 is a straight distance between the first belt marking 1331 and the second belt marking 1332, and diameter D2 is a straight distance between the second belt marking 1332 and the third belt marking 1333. The belt distance BD1 between a first belt marking 1331 and a second belt marking 1332 lies substantially along a circular path, so is substantially equal to diameter D1 times 7C divided by 2. Similarly, the belt distance BD2 between the second belt marking 1332 and a third belt marking 1333 is substantially along a circular path, so is substantially equal to diameter D2 times 7C divided by 2. The difference between diameter D1 and diameter D2 is about a thickness T of the belt. Therefore, the difference between the belt distance between the first and second belt markings 1331, 1332, and the belt distance between the second and third belt markings 1332, 1333 is about the thickness T times 7C divided by 2. Similarly, the belt distance for each successive belt marking toward the hoist end increases by about the thickness T times 7C divided by 2.

Note that the proportions of the belts shown in FIG. 6A, 6B, and FIG. 7 are not necessarily precise, and may be exaggerated for purpose of illustration. Specifically, the thickness of the belts is exaggerated for ease of description.

When loading or unloading the wafer container unit 400 on the load port 300, the horizontal position and orientation of the hoist unit 120 may be aligned to the horizontal position of the load port 300 so as to allow the wafer container unit 400 to successfully engage or disengage the load port 300 in a smooth manner.

In some other embodiments, the method M10 (or M10') further includes collecting an operating pulse of a motor of the wafer transport device. For example, the controller 180 may collect the operating pulse of the motor when the wafer transport device 100 moves on the transport rails 200. The controller 180 may auto-learn the proper pulse range of the motor by using the collected operating pulses as a database. The controller 180 may determine if the motor is abnormal (e.g., the transport speed is too slow or too fast) by comparing the collected operating pulse to the proper pulse range. If the collected operating pulse is out of the proper pulse range, the controller 180 will transport the corresponding wafer transport device to the maintenance area for maintenance.

In some other embodiments, the method M10 (or M10') further includes collecting an operating temperature of the motor of the wafer transport device. For example, the controller 180 may collect the operating temperature of the motor when the wafer transport device 100 moves on the transport rails 200. The controller 180 may auto-learn the proper temperature range of the motor by using the collected operating temperatures as a database. The controller 180 may determine if the motor is abnormal (e.g., the temperature of the motor is too high) by comparing the collected operating temperature to the proper temperature range. If the collected operating temperature is out of the proper temperature range, the controller 180 will transport the corresponding wafer transport device to the maintenance area for maintenance.

Figure 8A:
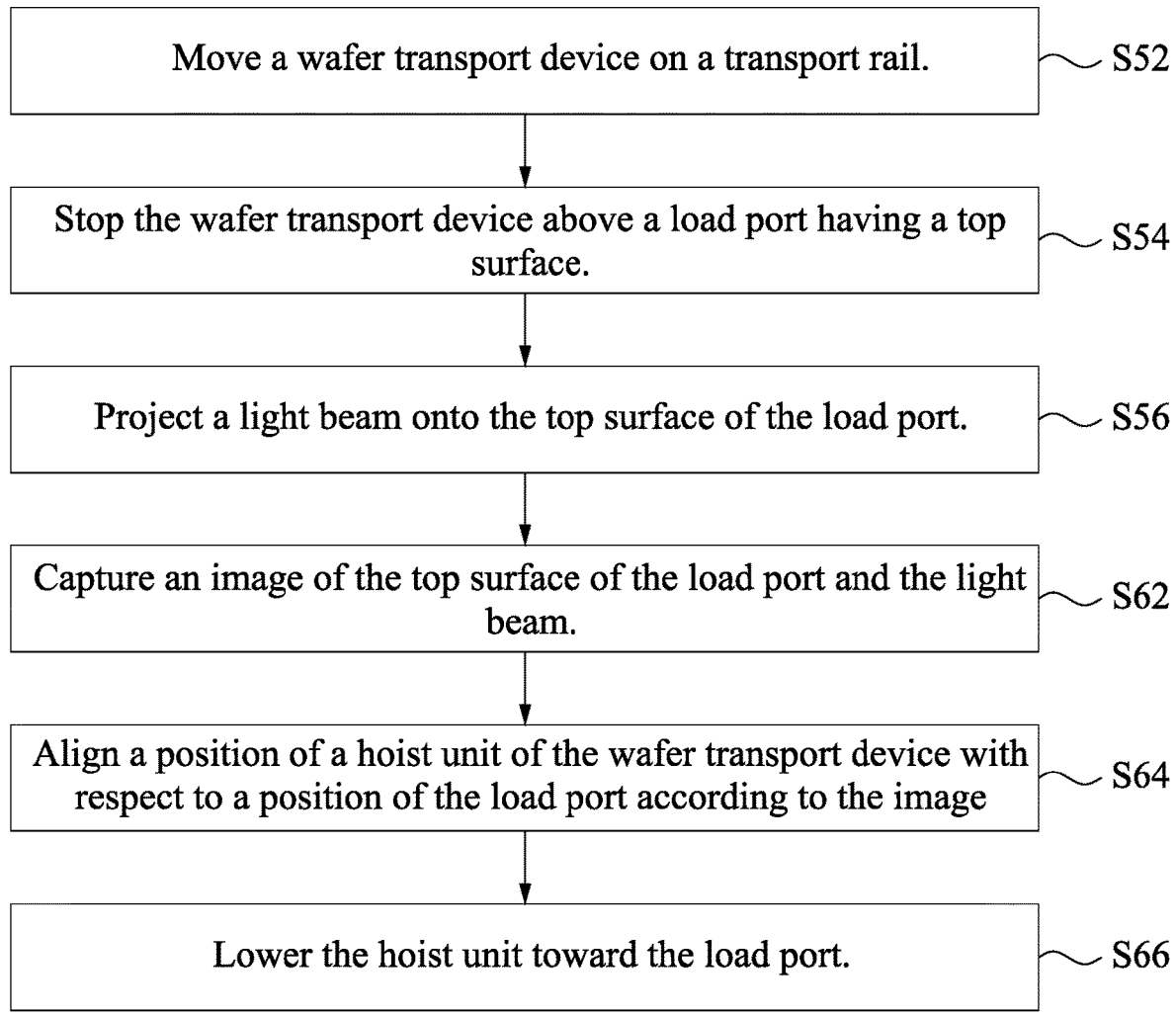
FIG. 8A shows a flowchart of a method according to some embodiments of the present disclosure.

FIG. 8A shows a flowchart of a method M20 according to some embodiments of the present disclosure. The method M20 is merely an example, and is not intended to limit the present disclosure beyond what is explicitly recited in the claims. Additional operations can be provided before, during, and after the method M20, and some operations described can be replaced, eliminated, or moved around for additional embodiments of the process. In some embodiments, the method M20 may be applied in a FAB. Specifically, the method M20 may be applied to, but should not be limited to, the wafer transport device 100 of FIG. 1. For clarity and ease of explanation, some elements of the figures have been simplified.

In operation S52 of the method M20, a wafer transport device 100 is moved on a transport rail 200. Referring to FIGS. 1 and 8A, the wafer transport device 100 is suspended from the transport rail 200. The controller 180 of the wafer transport system controls the movement of the wafer transport device 100, such that the wafer transport device 100 is moved on the transport rail 200.

In operation S54 of the method M20, the wafer transport device 100 is stopped above the load port 300 having the top surface 301. In some embodiments, there are many rail marks 210 on the bottom surface of the transport rail 200. The marking scanner of the wafer transport device 100 senses the bottom surface of the transport rail 200 when the wafer transport device 100 is moving on the transport rail 200. When the marking sensor senses a predetermined rail mark 210, the wafer transport device 100 receives a stop demand from the wafer transport system. Hence, the wafer transport device 100 is stopped over the predetermined load port 300. On the other hand, when the marking sensor senses another rail mark, the wafer transport system does not send a stop demand to the wafer transport device 100. In this case, the wafer transport device 100 is still moving on the transport rail 200.

In some embodiments, the wafer transport device 100 may be stopped at the wrong position because of inertia. For example, the wafer transport device 100 may be stopped past the predetermined position if the wafer transport device 100 was moving at a high speed. In this case, the wafer transport device 100 and the corresponding load port 300 are not aligned vertically. In some other embodiments, the orientation of the wafer transport device 100 is not aligned with the orientation of the corresponding load port 300 when the wafer transport device 100 is stopped over the corresponding load port 300. The controller 180 may thus send a rotation demand to the wafer transport device 100 (according to the data stored in the rail mark 210) to rotate the wafer transport device 100 (as described in operation S58 in FIG. 8B). As such, the orientations of the wafer transport device 100 and the load port 300 may be aligned. However, due to the law of inertia, the wafer transport device 100 may be over-rotated, and the orientations of the wafer transport device 100 and the load port 300 are misaligned again.

Figure 9:
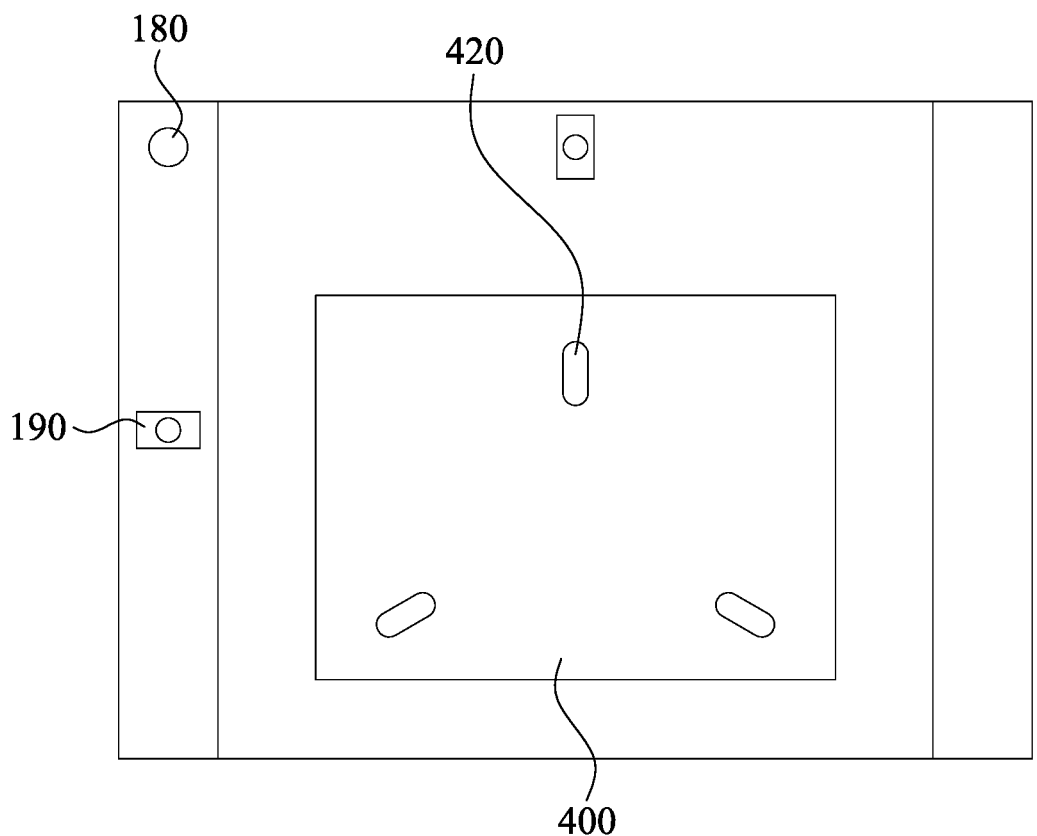
FIG. 9 shows a bottom view of the wafer transport device and the wafer container unit in FIG. 1 according to some embodiments of the present disclosure.
Figure 10B:
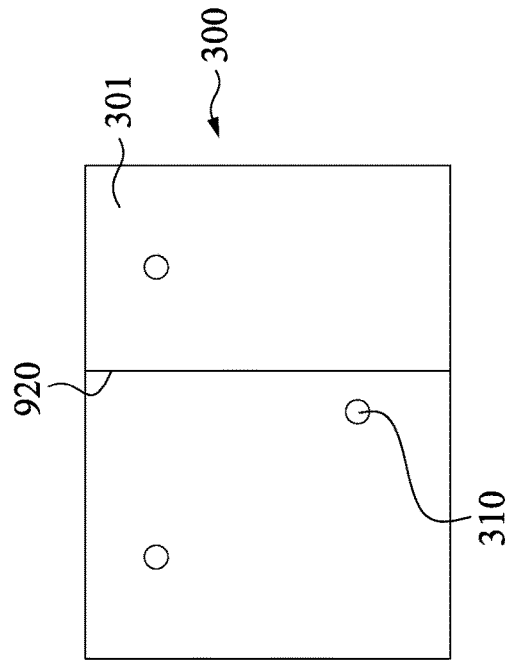
FIGS. 10A to 10D show top views of a top surface of a load port and at least one light beam projection thereon according to some embodiments of the present disclosure.
Figure 10D:
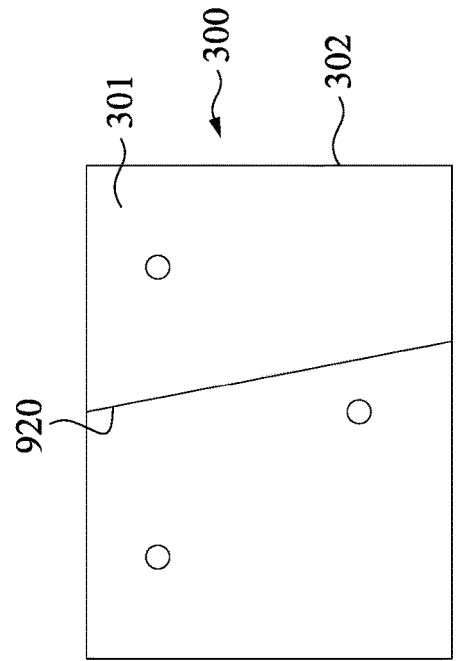
Figure 10A:
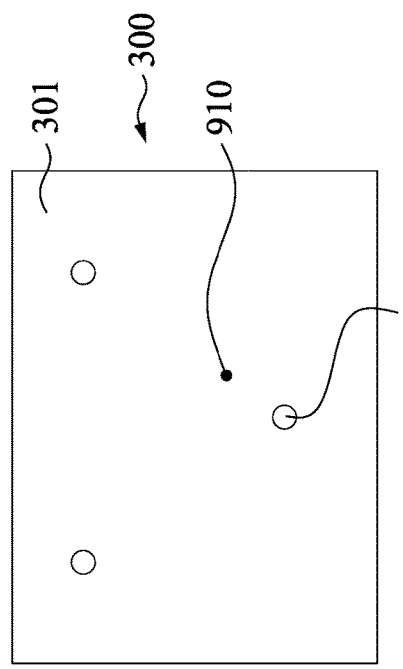
Figure 10C:
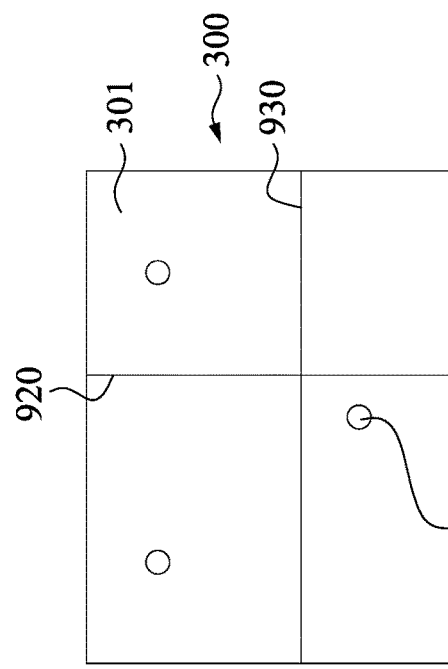

Due to the misalignment problems mentioned above, an alignment process may be performed after the wafer transport device 100 is stopped. In operation S56 of the method M20, a light beam is projected onto the top surface of the load port. FIG. 9 shows a bottom view of the wafer transport device 100 and the wafer container unit 400 in FIG. 1 according to some embodiments of the present disclosure. In some embodiments of the present disclosure, at least one light beam projector 190 is arranged on the main body 110 of the wafer transport device 100. The light beam projector 190 is configured to project a light beam onto the top surface 301 of the load port 300. The light beam projected onto the top surface 301 of the load port 300 can include a laser dot 910 as shown in FIG. 10A, a laser line 920 as shown in FIGS. 10B and 10D, or two laser lines 920, 930 as shown in FIG. 10C. In some embodiments, the laser lines 920 and 930 are not parallel. In some embodiments, the laser lines 920 and 930 are substantially perpendicular.

In operation S62 of the method M20, an image of the top surface of the load port and the light beam is captured. The relative position between the load port 300 and the wafer transport device 100 can be determined from the captured image. Referring to FIG. 9, a load port camera 180 is arranged on the main body 110 of the wafer transport device 100, and is configured to capture an image of the top surface 301 of the load port 300. As mentioned above and as shown in FIG. 1, the load port 300 has the protrusions 310 disposed on the top surface 301 thereof. Furthermore, the top surface 301 of the load port 300 has a plurality of edges, e.g., four edges.

FIGS. 10A to 10D show top views of a top surface of a load port and at least one light beam projection thereon according to some embodiments of the present disclosure. The captured image may include at least one of the protrusions 310, at least one edge 302 of the top surface 301 of the load port 300, and the light beam projected onto the top surface 301 of the load port 300. In some embodiments as shown in FIG. 10A, the relative positions of the laser dot 910 and the protrusion 310 of the load port 300 can be determined from the captured image. In some embodiments as shown in FIG. 10B, the relative positions of the laser line 920 and the protrusion 310 of the load port 300 can be determined from the captured image. In some embodiments as shown in FIG. 10C, the relative positions of the laser lines 920, 930 and the protrusion 310 of the load port can be determined from the captured image. In some embodiments as shown in FIG. 10D, the relative orientation of the laser line 920 and the edge 302 of the top surface 301 of the load port 300 can be determined from the captured image. In other words, an angle between the laser line 920 and the edge 302 of the top surface 301 of the load port 300 is determined from the captured image.

In operation S64 of the method M20, a position of a hoist unit 120 of the wafer transport device 100 is aligned with respect to a position of the load port 300 according to the image. For example, in FIG. 10A, in a default setting, the load port 300 and the wafer transport device 100 are aligned with each other when the laser dot 910 overlaps the protrusion 310 of the load port 300. The captured image of FIG. 10A shows the load port 300 and the wafer transport device 100 are misaligned. Therefore, the wafer transport device 100 is moved horizontally by the controller 180 until the laser dot 910 is on the protrusion 310 of the load port 300. Similarly, in FIG. 10B, the default setting is that the laser line 920 crosses the protrusion 310 of the load port 300. Therefore, the wafer transport device 100 is moved horizontally by the controller 180 until the laser line 920 passes through the protrusion 310 of the load port 300. In FIG. 10C, the default setting is that the laser lines 920 and 930 both cross the protrusion 310 of the load port 300. Therefore, the wafer transport device 100 is moved horizontally by the controller 180 until each of the laser lines 920, 930 passes through the protrusion 310 of the load port 300. In FIG. 10D, the default setting is that the laser line 920 is parallel to one edge 302 of the top surface 301 of the load port 300. Therefore, the hoist unit 120 is rotated until the laser line 920 is parallel to the corresponding edge 302 of the top surface 301 of the load port 300.

It is noted that the default setting mentioned above are examples, and should not limit the present disclosure. In some other embodiments, the default settings include the laser dot 910 overlapping with other elements (such as another protrusion or one edge of the top surface 301), the laser line 920 (930) crossing other elements (such as another protrusion), the laser lines 920 (930) and an edge of the top surface forming an angle greater than 0 degrees, etc.

In operation S66 of the method M20, the hoist unit 120 is lowered toward the load port 300. After the wafer transport device 100 is aligned with the load port 300 by performing the alignments mentioned above, the belt winding drums 140 rotate to unwind the belts 130. As such, the hoist unit 120 can be lowered to a predetermined level.

Figure 8B:
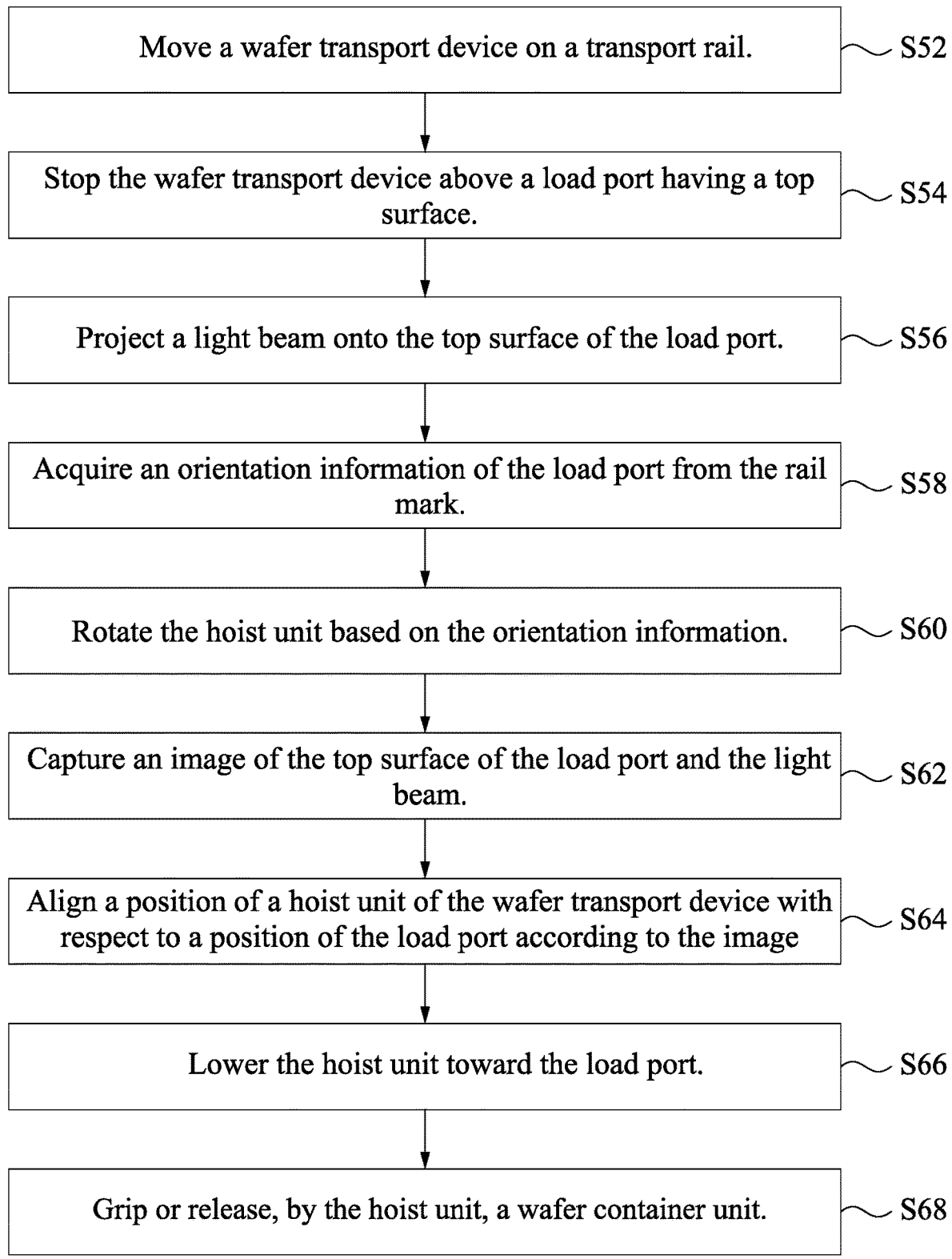
FIG. 8B shows a flowchart of a method according to some embodiments of the present disclosure.

FIG. 8B shows a flowchart of a method M20' according to some embodiments of the present disclosure. The method M10' is merely an example, and is not intended to limit the present disclosure beyond what is explicitly recited in the claims. Additional operations can be provided before, during, and after the method M10, and some operations described can be replaced, eliminated, or moved around for additional embodiments of the process. The operations S52, S54, S56, S62, S64, and S66 of method M20' are the same as the operations S52, S54, S56, S62, S64, and S66 of method M20, and the detailed description is omitted herein.

In operation S58 of the method M20', an orientation information of the load port 300 is acquired from the rail mark 210. In some embodiments, the rail mark 210 is a barcode having the orientation information of the load port 300 located there-below.

In operation S60 of the method M20', the hoist unit 120 is rotated based on the orientation information. In some embodiments, the hoist unit 120 is rotated based on the orientation information, before operation S62 wherein the image of the top surface 301 of the load port 300 is captured by the load port camera 180.

In operation S68 of the method M20', after the hoist unit 120 is properly aligned with the load port 300 in operation S66, the hoist unit 120 is lowered toward the load port 300, and the wafer container unit 400 gripped by or released from the hoist unit 120. Specifically, the gripper 122 of the hoist unit 120 is operated to grip or release the wafer container unit 400, and the wafer container unit 400 is loaded onto or picked up from the load port 300.

The present disclosure provides devices and methods for determining an attitude of the hoist unit, such that the wafer container unit can be loaded to and picked up from the load port by the hoist unit in a smooth manner. Furthermore, the present disclosure provides devices and methods for determining an orientation and a horizontal position of the hoist unit with respect to the load port, such that the wafer container unit can be loaded to and picked up from the load port by the hoist unit in a smooth manner.

According to some embodiments of the present disclosure, a wafer transport device is moved on a transport rail. The wafer transport device is stopped above a load port having a top surface. A light beam is projected onto the top surface of the load port. An image of the top surface of the load port and the light beam is captured. A position of a hoist unit of the wafer transport device is aligned with respect to a position of the load port according to the image. The hoist unit is lowered toward the load port.

According to some embodiments of the present disclosure, a wafer transport device is moved toward a process bay comprising a load port. A hoist unit of the wafer transport device above the load port is lowered. An attitude of the hoist unit is determined. A response is provided by a controller, according to the determined attitude.

According to some embodiments of the present disclosure, a wafer transport system includes a transport rail, and a wafer transport device. The wafer transport device is movably arranged on the transport rail, and includes a main body, a plurality of belt winding drums disposed on the main body, a plurality of belts connected to and wound around the respective belt winding drums, a plurality of winding cameras configured to capture images of the sides of portions of the belts wound around the belt winding drums, and a hoist unit connected to the plurality of belts. Each of the belts has belt markings formed on a side of the belt.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
moving a wafer transport device to a position above a load port;
lowering a hoist unit of the wafer transport device above the load port, wherein the wafer transport device has a plurality of belts, each of the belts is connected to the hoist unit and wound around a respective belt winding drum;
detecting sound waves from the belts by using acoustic sensors to measure tensions of the belts; and
comparing the tensions of the belts to determine an inclination of the hoist unit.

2. The method according to claim 1, further comprising:
gripping a wafer container unit prior to lowering the hoist unit; and
after determining the inclination of the hoist unit, if a top surface of the hoist unit is substantially parallel to a top surface of the load port, releasing the wafer container unit onto the top surface of the load port.

3. The method according to claim 1, further comprising:
after determining the inclination of the hoist unit, if a top surface of the hoist unit is substantially parallel to a top surface of the load port, gripping a wafer container unit placed on the top surface of the load port.

4. The method according to claim 1, further comprising:
after determining the inclination of the hoist unit, if a top surface of the hoist unit is not parallel to a top surface of the load port, raising the hoist unit; and
sending the wafer transport device to a maintenance area.

5. The method according to claim 4, further comprising:
calibrating the inclination of the hoist unit after sending the wafer transport device to the maintenance area.

6. The method according to claim 1, further comprising:
raising the hoist unit after determining the inclination of the hoist unit;
determining a degree of winding of each of the belts around the corresponding belt winding drum; and
providing a response, by a controller, according to the determined degree of winding.

7. A method comprising:
moving a wafer transport device on a transport rail, wherein the wafer transport device comprises a main body, a plurality of belt winding drums disposed on the main body, a hoist unit configured to grip a wafer container unit, and a plurality of belts connected between the belt winding drums and the hoist unit;
stopping the wafer transport device above a load port;
after stopping the wafer transport device, lowering the hoist unit through the belts;
measuring a tension status of each of the belts during lowering the hoist unit;
comparing the tension statuses of the belts; and
in response to a comparison result of the tension statuses, determining whether the hoist unit is inclined.

8. The method according to claim 7, wherein measuring the tension status is performing with using a tension sensor disposed on the main body of the wafer transport device and in a position vertically between the belt winding drums and the hoist unit.

9. The method according to claim 8, wherein the tension sensor is an acoustic sensor.

10. The method according to claim 7, wherein measuring the tension status is performed by detecting frequencies of vibrations on the belts.

11. The method according to claim 10, further comprising:
performing a machine learning on the frequencies of the vibrations on the belts to determine the tension statuses of the belts by a machine learning system.

12. The method according to claim 7, measuring the tension status is performed by inspecting windings of the belts around the belt winding drums.

13. The method according to claim 7, further comprising:
measuring frequencies of vibrations of the belts during lowering the hoist unit.

14. The method according to claim 13, further comprising:
analyzing a plurality of data pairs of the vibration frequencies and the tension statuses to receive a vibration frequency and tension relationship by a machine learning system.

15. A method comprising:
transferring a wafer container unit by using a wafer transport device, wherein the wafer transport device comprises:
a main body;
a plurality of belt winding drums disposed on the main body;
a hoist unit; and
a plurality of belts connecting the belt winding drums to the hoist unit;
stopping the wafer transport device with the wafer container unit above a load port;
lowering the hoist unit of the wafer transport device above the load port;
measuring vibration frequencies of the belts;
in response to the vibration frequencies of the belts, determining lengths of the belts extending between the belt winding drums and the hoist unit; and
in response to the determination determines that an attitude of the hoist unit is acceptable, actuating a movement of a wafer container relative to the load port through the hoist unit.

16. The method according to claim 15, wherein measuring the vibration frequencies is performed by receiving sound waves generated from the belts during lowering the hoist unit.

17. The method according to claim 15, wherein the step of actuating the movement of the wafer container relative to the load port through the hoist unit is to release the wafer container unit form the hoist unit to the load port.

18. The method according to claim 15, wherein the step of actuating the movement of the wafer container relative to the load port through the hoist unit is to grip the wafer container unit placed on the load port.

19. The method according to claim 15, further comprising:
in response to the determination determines that the attitude of the hoist unit is not acceptable, calibrating the attitude of the hoist unit.

20. The method according to claim 15, further comprising:
raising the hoist unit after determining the attitude of the hoist unit;
determining a degree of winding of each of the belts around the belt winding drums; and
providing a response, by a controller, according to the determined degrees of windings.

\* \* \* \* \*